US00RE36987E

United States Patent [19]

Tupper et al.

[11] E Patent Number: Re. 36,987

[45] Reissued Date of Patent: Dec. 12, 2000

[54] COMPENSATING FOR NON-LINEAR EFFECTS IN SIGNAL PROCESSING WITH ACTIVE DEVICES

[75] Inventors: George Ivor Frederick Tupper, High Wycombe; Anthony Colin Allegranza, London; Phillip Joseph Doherty, Crumlin Co. Antrim, all of United Kingdom

[73] Assignee: British Broadcasting Corporation, London, United Kingdom

[21] Appl. No.: 09/112,033

[22] PCT Filed: May 27, 1993

[86] PCT No.: PCT/GB93/01106

§ 371 Date: Dec. 16, 1994

§ 102(e) Date: Dec. 16, 1994

[87] PCT Pub. No.: WO93/26086

PCT Pub. Date: Dec. 23, 1993

Related U.S. Patent Documents

Reissue of:

[64] Patent No.: 5,534,820
Issued: Jul. 9, 1996
Appl. No.: 08/338,557
Filed: Dec. 16, 1994

[30] Foreign Application Priority Data

Jun. 9, 1992 [GB] United Kingdom ..... 92 12151

[51] Int. Cl.[7] ..... H03F 1/32

[52] U.S. Cl. ..... 330/149; 330/45; 348/723

[58] Field of Search ..... 330/149, 724, 330/45; 348/723

[56] References Cited

U.S. PATENT DOCUMENTS 4,604,589 8/1986 McGann ..... 330/205

4,905,086 2/1990 Tahara ..... 330/44

FOREIGN PATENT DOCUMENTS 0028181 5/1981 European Pat. Off. .

OTHER PUBLICATIONS

C. J. Edgcombe et al. "The Television Performance of the Klystron Amplifier" The Institution of Electronic & Radio Engineers, 1971 pp. 1–12.

R. Blum et al. "Modeling Nonlinear Amplifiers for Communication Simulation" IEEE International Conference on Communications, vol. 3, Jun. 11, 1989 Boston, MA pp. 1468–1472.

*Primary Examiner*—Michael B. Shingleton
*Attorney, Agent, or Firm*—George W. Neuner; Dike, Bronstein, Roberts and Cushman, LLP

[57] ABSTRACT

In signal processing circuitry using active devices, non-linearity of the device causes distortion of pure tones and the generation of intermodulation products for more complex signals. The transfer characteristics of such active devices may be considered as the accumulated characteristics of input and output filter stages separated by a non-linear region. To compensate for non-linearities and reduce intermodulation products, a drive circuit comprises pre- and post-correction filters separated by a compensating amplifier. The frequency response of the pre-correction filter corresponds to that of the input filter stage but is reversed in the frequency spectrum; with conventional I.F. the transfer characteristic of the amplifier and frequency response characteristic of the post-correction filter are the respective complements, of those of the non-linear region and pre-correction filter. The circuitry may be extended to compensate for active devices having more than one non-linear region and has particular application to klystron amplifiers used in broadcast television transmitters.

24 Claims, 6 Drawing Sheets

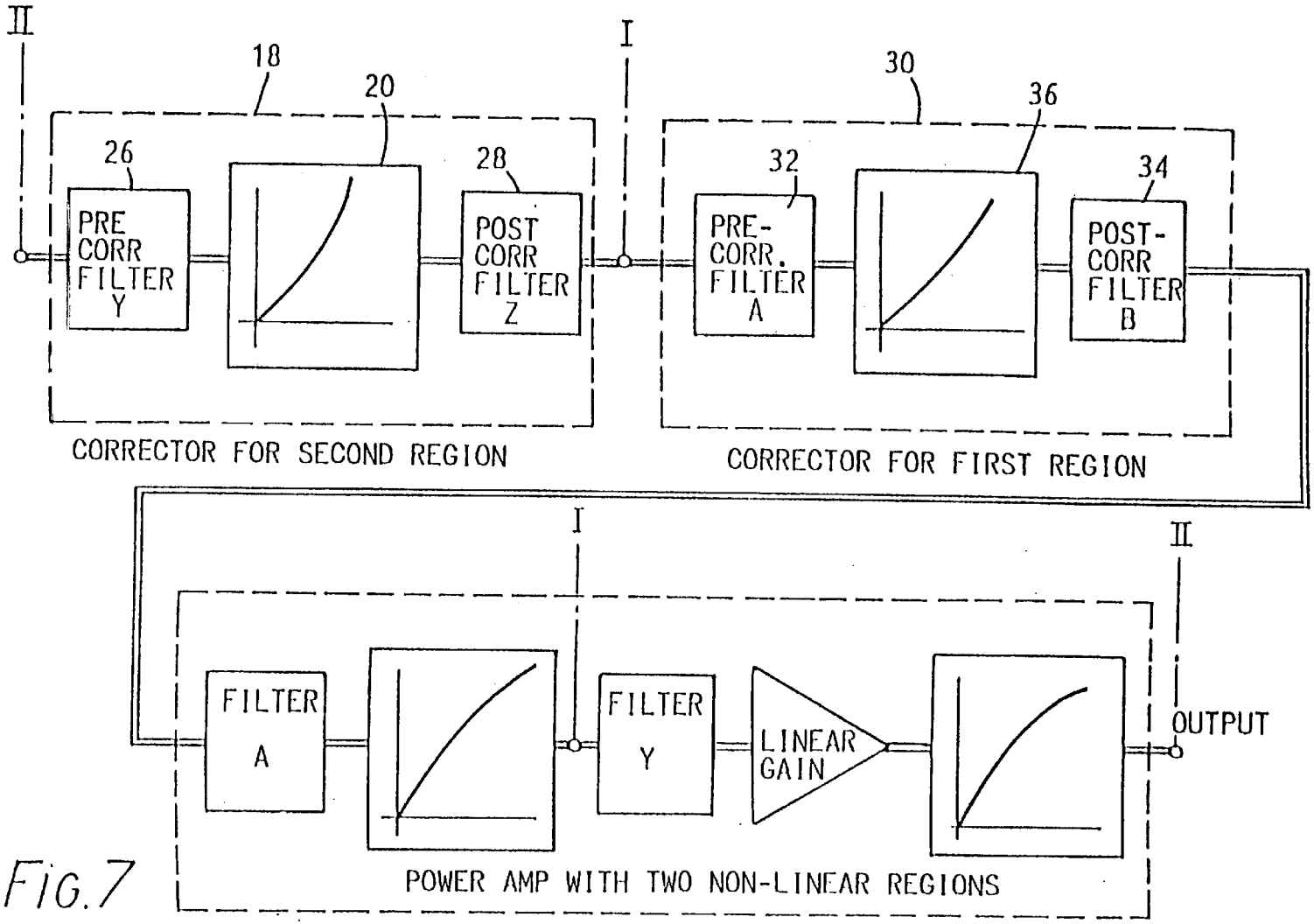
FIG. 7
AMENDED

COMPENSATING FOR NON-LINEAR EFFECTS IN SIGNAL PROCESSING WITH ACTIVE DEVICES

Matter enclosed in heavy brackets [ ] appears in the original patent but forms no part of this reissue specification; matter printed in italics indicates the additions made by reissue.

TECHNICAL FIELD

This invention relates to signal processing circuitry using an active device and in which inter-modulation products due to non-linearity of the active device are reduced. The invention will be described in the context of a klystron amplifier used in a broadcast television transmitter, to which it is particularly applicable, but the invention is not limited to such systems.

BACKGROUND ART

A basic background description of such transmitters is to be found in a paper by C. J. Edgcombe and C. N. O'Loughlin entitled "The Television Performance of the Klystron Amplifier" published in The Radio and Electronic Engineer, September 1971. That paper describes in particular the 4-cavity klystron and the fact that it has a non-linear behaviour. As the input power is increased from zero towards the saturation value, with a single-frequency carrier wave input, the ratio of output power to input power decreases. A phase shift can also be introduced. This non-linearity is compensated by pre-correction either at video (baseband) frequency or more often at intermediate frequency (IF).

Such non-linearity exists in general when the change in level of the output signal is not exactly proportional to the change in level of the input signal, i.e., the input/output transfer characteristic is not precisely linear. All active devices are non-linear to some extent. Their non-linear effects tend to worsen with increases in output signal level and in conversion efficiency i.e., AC power out/DC power in. The effect, in the region of non-linearity of a periodic device that is incapable of harmonic response, is to produce output distortion of a single pure input tone which takes the form of amplitude change (normally a reduction) of the pure output tone, as noted above. Additionally, intermodulation products are produced when the input consists of more than one pure tone or is a complex signal. Finally variations in amplitude or phase of one of the tones are inversely superimposed on the others; this effect is termed cross-talk.

Intermodulation produces (IPs) are usually unwanted distortion components of sum and difference terms of the various signal frequencies Of a multi-tone signal or a complex waveform that is being processed by a non-linear device. These unwanted components from a complex waveform, such as a television signal, occur across a very broad band but are tailored by the response of a periodic device when set up to the normal pass band such as for a TV signal (normally from −1.25 MHz to +5.5 MHz relative to vision carrier frequency).

In-band intermodulation products, due to the TV signal components, are rarely at a high enough level to be a subjective nuisance particularly as they are non-coherent in their nature. However, in-band components created by the introduction of a relatively high level additional sound carrier, in common colour vision and sound amplifier working, can produce coherent and significantly large distortion tones at, typically, plus and minus 1.5 MHz relative to vision carrier frequency if the amplifier is sufficiently non-linear. This frequency of 1.57 MHz is the difference between the sound subcarrier, 6 MHz, and the vision subcarrier, 4.43 MHz. If this is an output-modulated amplifier such inter-modulation effects restrict the power output and efficiency obtainable from such a device for a given specified performance for unwanted spurious emissions in the image side band.

Likewise intermodulation components can be produced by the complex TV signal alone in the lower or image sideband of the TV channel. These are specified to be less than −37 dBp (relative to peak sync., carrier) except for image subcarrier at −4.43 MHz which is restricted to −47 dBp. These specified limits are to minimise lower adjacent channel interference in the adjacent service areas of other transmitters. This also restricts the efficiency to which a vision output power amplifier can be operated.

The presence of the image sideband components, even at the currently specified levels, also prevents the use of this part of a TV channel for other transmissions which in themselves would not be allowed to cause lower adjacent channel interference. It has been determined empirically that digital bearer carriers at a level of 43 dBp at −3.6 MHz and −5.6 MHz relative to vision carrier would not cause lower adjacent channel problems. With the above image sideband specification it will be necessary to further attenuate the radiated vision image interference components by about 15 db, even if a separate transmitter and aerial system were used for the digital bearers, in the lower sideband of an existing television transmission from the same site.

Thus, in summary, non-linearity restricts the power output and efficiency of an active device. This is important because of running costs with high power RF amplification stages. Non-linearity also prevents the effective utilisation of the lower sideband of TV channels due to the relatively high levels of regenerated image components. The in-band intermodulation products severely restrict the power output and the efficiency of devices such as klystrons operating as common colour vision and sound amplifiers.

SUMMARY OF INVENTION

In accordance with the present invention there is provided a method of compensating for non-linear characteristics of an active device, the active device having a transfer characteristic corresponding to the accumulated characteristics of a first filter stage and a first non-linear device in series connection, the method comprising modifying a signal prior to supply to the active device by the steps of:

a) filtering the signal by a first pro-correction filter having a frequency response characteristic determined by that of the said first filter stage;

b) amplifying the pro-correction filtered signal using a first non-linear amplifier having an input/output transfer characteristic complementary to that of the said first non-linear device; and c) filtering the amplified signal by a first post-correction filter having a frequency response characteristic complementary to that applied at step a).

The present invention also provides a signal processing circuit comprising a first drive circuit and an active device connected in series between a processing circuit signal input and signal output, the active device having a transfer characteristic corresponding to the accumulated characteristics of a first filter stage and a first non-linear device in series connection, and the first drive circuit comprising, in series connection from a drive circuit signal input:

i) a first pre-correction filter having a frequency response characteristic determined by that of the said first filter stage;

ii) a first non-linear amplifier having an input/output transfer characteristic complementary to that of the said first non-linear device; and iii) a first post-correction filter having a frequency response characteristic complementary to that of the said first pre-correction filter;

wherein the output of the said first post-correction filter provides a drive circuit signal output.

The frequency response characteristic of the pre-correction filter is preferably substantially identical to that of the first filter stage whilst being reversed in the IF frequency spectrum. This may be achieved using known drive up-converter design techniques. The method and circuitry embodying the invention may be extended to provide multiple pre- and post-correction filtering stages and to provide compensation for active devices having more than one non-linear region, as will be described in greater detail hereinafter and defined in the attached claims to which reference should now be made.

As previously mentioned, the present invention is particularly applicable to a klystron amplifier used in a broadcast television transmitter. According to a further embodiment of the present invention, in such a transmitter, in which said klystron amplifier comprises a drive circuit and a klystron driven by said drive circuit, said klystron having a transfer characteristic corresponding to the accumulated characteristics of a first filter stage and a first non-linear device in series connection, and said drive circuit having an input and output and comprising a non-linear amplifier having an input-output transfer characteristic complementary to that of said klystron first non-linear device, the improvement residing in that said drive circuit further comprises a pro-correction filter connected between said drive circuit input and said non-linear amplifier, and a post-correction filter connected between said non-linear amplifier and said drive circuit output, wherein said pro-correction filter has a frequency response characteristic determined by that of said first filter stage and said post-correction filter has a frequency response characteristic complementary to that of said pro-correction filter.

In essence, we propose adding a pre-correction filter prior to the compensating amplifier and a post-correction filter after it. The pro-correction filter effectively has a substantially similar frequency response to that part of the klystron prior to the non-linear amplification zone, and the post-correction filter has a frequency response which complements that of the pro-correction filter.

Nowadays, most high power klystron TV transmitters use synchronising-pulse control to improve efficiency and the present correction method has particular application to this. Typically, sync-pulsing improves the efficiency (peak-of-sync) from 40% to 60%. During the sync periods, the beam current is increased, relative to that during the picture period when the beam is set to that value required for black level with a correctable linearity. This means that the non-linearity of the device is different between the picture and sync periods. The present correction method is preferably applied to the non-linearity of the picture periods: when the non-linearity is changed by switching-up for sync periods, the different non-linearity which is no longer corrected properly does not generally have a serious effect due to the absence of picture signal components forming intermodulation products and the output spectrum is limited to a narrow band of a few hundred kHz around the vision carrier. More serious effects will however be caused during common amplification where bearer tones are present in one image side-band during sync periods. To compensate for the imperfect correction (where the correction method is set up for the picture period) further compensation, by inverse amplitude and phase modulation, may be applied in the bearer drives for the synchronising periods.

BRIEF DESCRIPTION OF DRAWINGS

The invention will be described in more detail, by way of example, with reference to the drawings, in which:

FIG. 7 is a block diagram of an extended klystron amplifier system embodying the invention, in which correction is provided for two regions of the klystron.

MODES FOR CARRYING OUT THE INVENTION

Figure 1:
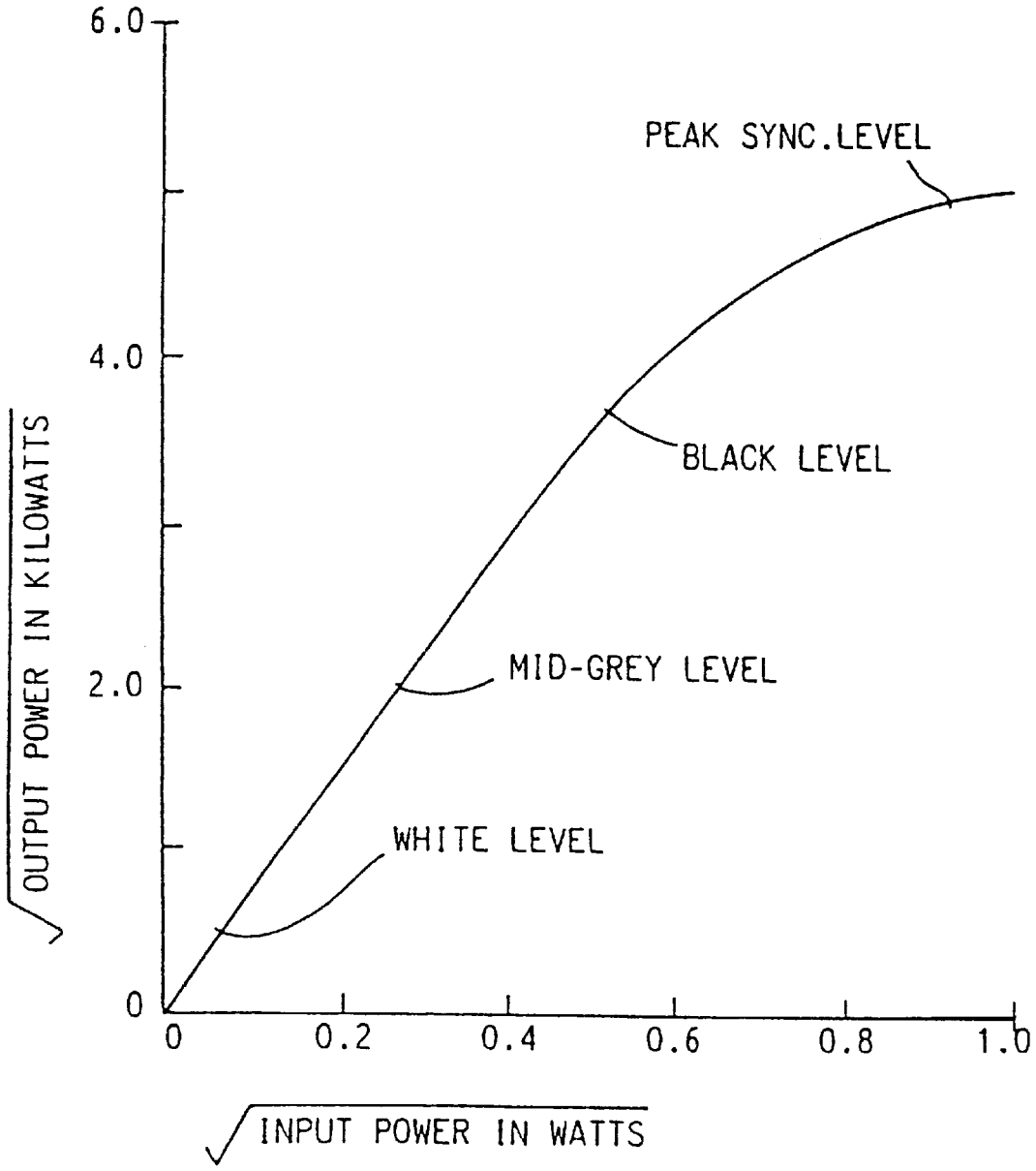
FIG. 1 PRIOR ART
FIG. 1 is a diagram illustrating a typical klystron transfer characteristic, as given in the Edgcombe and O'Loughlin paper above.

Referring to the drawings, FIG. 1 illustrates a typical input/output transfer characteristic for a klystron amplifier, showing that the output voltage or power is not directly proportional to the input voltage or power particularly at high amplitudes. As high power broadcast transmitter amplifiers are desired to provide as high an output as possible for a given input power, this non-linearity is a serious problem from the point of view of efficiency versus quality of performance.

Figure 2:
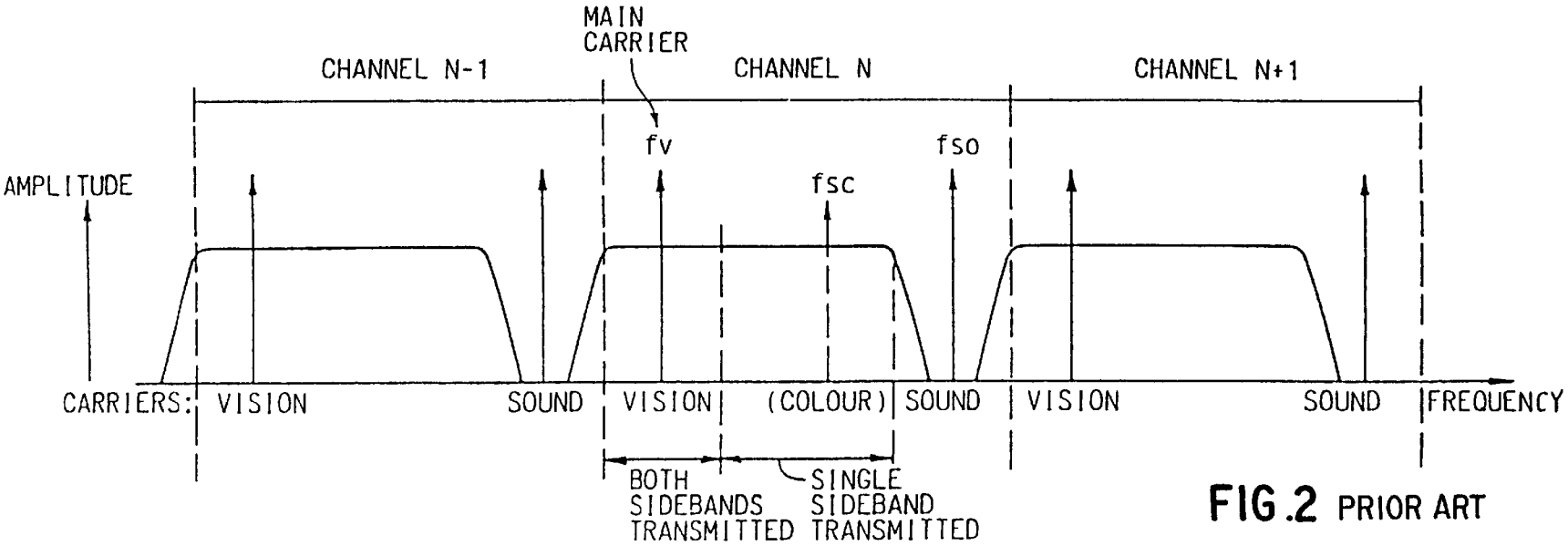
FIG.2 PRIOR ART
FIG. 2 is a spectrum diagram illustrating three adjacent vestigial sideband television channels.

FIG. 2 illustrates diagrammatically the spectrum of three adjacent television channels. The colour subcarrier fsc and sound carrier fso are shown by upward arrows, ant the region where the main vision components arise is also shown by an upward arrow. The transmission is by the vestigial sideband (VSB) technique such that there is a small lower sideband below the main (vision) carrier. With a non-linear amplifier, intermodulation products can arise between the colour subcarrier and sound carrier. In the PAL System I which is used in the United Kingdom, fso is 6 MHz and fsc is 4.43 MHz, giving an intermodulation frequency of 1.57 MHz. The distortion tone at plus 1.57 MHz relative to the vision carrier is within the vision band, and the distortion tone at minus 1.57 MHz is on the VSB slope. Further problems can arise with intermodulation signals caused by frequencies in the vision signal itself.

Figure 3:
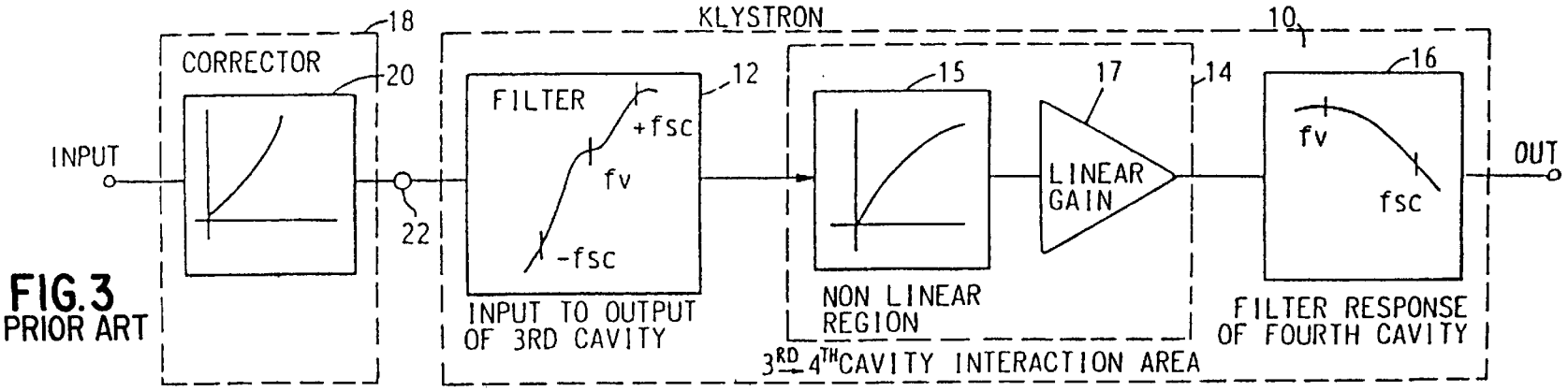
FIG.3 PRIOR ART
FIG. 3 illustrates a conventional four cavity klystron amplifier showing the IF drive corrector and the effective shaping filter responses due to the first three and the fourth klystron cavities.

FIG. 3 is a classical representation of a four-cavity klystron amplifier system. The klystron can be regarded, at least to a first order, as being equivalent to the components shown in the chain-dotted box 10 in FIG. 3. These components comprise an input filter 12, a non-linear gain stage 14 and a second filter 16. The input filter 12 represents the combined response of the first, second and third cavities, with the main vision frequency fv and the colour subcarrier frequency (plus and minus) fsc indicated. The non-linear gain stage 14 comprising a non-linear device 15 and a linear amplifier 17 represents the interaction area between the third and fourth cavities. The filter 16 describes the response of the fourth cavity.

The klystron amplifier non-linear response, as shown in FIG. 1, mainly arises in the interaction area between the third and fourth cavities. Hence it has been proposed to include a compensating amplifier 20 as a wide-band linearity corrector circuit in the IF drive 18 coupled to the klystron input 22. The amplifier 20 has a transfer characteristic which is complementary to that of the non-linear stage 14, such that the combined transfer characteristic of the two is linear.

In use the klystron 10 is tuned to give the required flat upper sideband response with a standard double-sideband input sideband analysis signal at a particular lift level, usually half lift (mid grey).

A typical wideband corrector has a flat frequency response from vision carrier to at least plus and minus 6 MHz for normal operating signal levels. Therefore the input to the corrector amplifier 20 from the rest of the drive correction system 18 is required to be flat over the TV band, but tailored by the VSB filter, say from −1.25 MHz to +5.5 MHz relative to vision carrier.

Therefore at the normal signal lift level the input to the corrector 20 has to be flat in the TV part of the VSB channel. The linearity corrector 20 therefore will generate image sideband (intermodulation products) from the input VSB signal of lift (carrier) and sweep frequencies according to this flat response across the band −1.25 MHz to +5.5 MHz relative to vision carrier. These image IPs will extend from the VSB "skirt" to −5.5 MHz.

The corrected signal consisting of TV components and image sideband components will be subject to the input filter 12 of the klystron. Hence the TV signal at the output of filter 12 and presented to the klystron non-linear stage 14 will be subjected to a rising response with increase in frequency. The klystron's inverse non-linearity to that of the corrector will produce image sideband components with levels and phases subject to the klystron input filter's phase and amplitude response. The image correction components formed by the drive wideband corrector 20 will however be subjected to a different filtering effect by the klystron input filter 12 resulting in increasing attenuation for frequencies Further away from, and below, the carrier, and in phase change effects determined by the image component phase response of the klystron input filter. Therefore there is no chance of image correction components cancelling with similar components generated from the TV signals in the non-linear area of the klystron.

Figure 4:
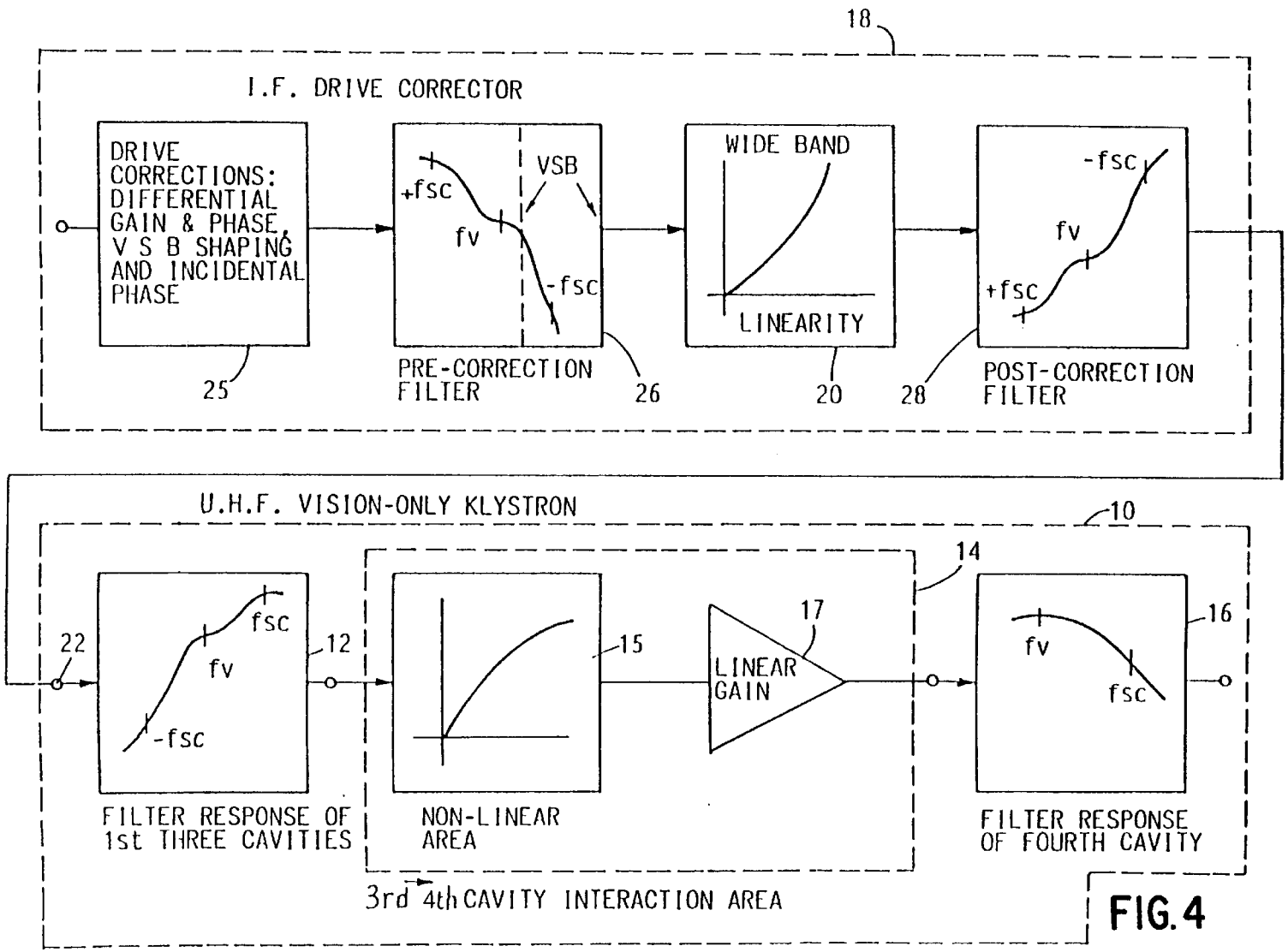
FIG. 4 is a corresponding diagram snowing a klystron amplifier system embodying the present invention with additional circuitry in the IF drive corrector.

FIG. 4 illustrates an embodiment of the invention in which the intermodulation products are reduced. The circuit model of the klystron 10 is the same as in FIG. 3. However additional elements are shown in the IF drive circuit 18. These comprise a pro-correction filter 26 connected prior to the compensating amplifier 20 and a post-correction filter 28 connected after the compensating amplifier 20. The pro-correction filter 26 has exactly the same frequency response as the assumed filter 12 in the klystron, save only that because it is operating at intermediate frequency the spectrum is actually "back-to-front" compared with filter 12, i.e. low frequencies in filter 12 become high frequencies in filter 26, and vice versa.

Differential response effects of the klystron, particularly those around the colour subcarrier, are compensated for by a change in gain and phase at varying levels with frequency. This is accomplished by a drive corrector 25 applying the differential gain and phase correction in the drive before the linearity corrector. We have appreciated that to achieve image IP cancellation a similarly tailored TV signal must be applied to the corrector as is applied to the klystron non-linear section 14. To do this a filter 26 having an exactly similar phase and amplitude response to the input klystron filter is required, at the input of the wideband linearity corrector. This will generate similar but antiphase IP components to those generated by the klystron non-linearity when presented with a pristine TV signal at its input. However, to do this the TV signal at the output of corrector 20 has to be restored to its original condition. This requires another filter 28 with a complementary phase and amplitude characteristic to the klystron input filter over plus and minus 6 MHz relative to vision carrier. If this is achieved the IP components generated by the wideband linearity corrector 20 are applied to the input of the klystron non-linear area 14 in the right relative amplitudes and phases to cancel those produced by the original pristine TV signals in the klystron non-linear area within the image channel for varying levels and frequencies of the TV signals.

Assuming the standard set-up situation described above with reference to FIG. 3, but instead of a sweep signal consider two fixed sub-carriers presenting a similar "loading" to that of the sweep on half lift. One of the IPs produced by the klystron non-linearity could be in the TV part of the channel (e.g. Vis plus typically 2.5 MHz and 4.5 MHz signals giving IPs at plus and minus 2 MHz). These two vision signals could well represent components in an actual TV signal. Such a composite signal would normally be supplied to the input of the corrector in she standard drive. Plus and minus 2 MHz components would be generated by the wideband non-linearity corrector 20. Considering the +2 MHz component, this is subject to the amplitude and phase responses at +2 MHz of the klystron input filter 12 before appearing at the input of the non-linear section 14 of the klystron 10. The +2 MHz component generated in the klystron will have been subject to the amplitude and phase responses of the klystron input filter at carrier frequency, +2.5 MHz and +4.5 MHz and hence is highly unlikely to be cancelled by the 2.5 MHz component generated by the corrector.

If pro- and post-correction filters 26, 28 are now considered to be added and set up as previously described for effective cancellation, then the plus 2 MHz correction component in the TV part of the channel can be arranged to effectively cancel the component generated by the klystron as described above.

An extrapolation of this reasoning can be applied to the case of the mono sound and vision common amplifier in reserve working conditions (having separate sound and vision klystrons under normal full power working, with either klystron providing a 'cut-back' reduced power reserve condition in the event of failure of the other) with the plus 1.57 MHz IP in the TV part of the channel. By using this correction method the IP could be significantly reduced and hence the overall efficiency of common amplification working could be increased for the same acceptable IP interference level. In this case however the sound and vision signals would have to be mixed at IF before feeding the pro-correction filter 26 in front of the wideband non-linearity corrector 20.

Similar principles can apply to the efficiency improvement of common amplification of mono and stereo sound signals in TV in klystrons. Here, of course, pro- and post-correction filter responses would have to be adapted to suit the very different klystron tuning situation.

With vision-only operation of a klystron, the proposed improved pro-correction method can reduce the image channel reinserted components by greater than 15 dBs and permits the introduction of at least two data channels at −43 dBp in the image of the channel on the same transmitter site. This can be done either as common amplifier working in the vision klystron, or with separate low power digital transmitters and a separate aerial system. In either case this improved pre-correction method avoids the cost and temperature stability problems associated with large adsorption filters in the output of a high power TV transmitter.

It is possible to increase the operating efficiency of common amplifier working within the current specification for the in-channel IP interference levels. Typical common amplifier arrangements are:

a) Mono sound with vision.

b) Mono sound with stereo sound.

c) Mono and stereo sound with vision (not currently employed).

Figure 5:
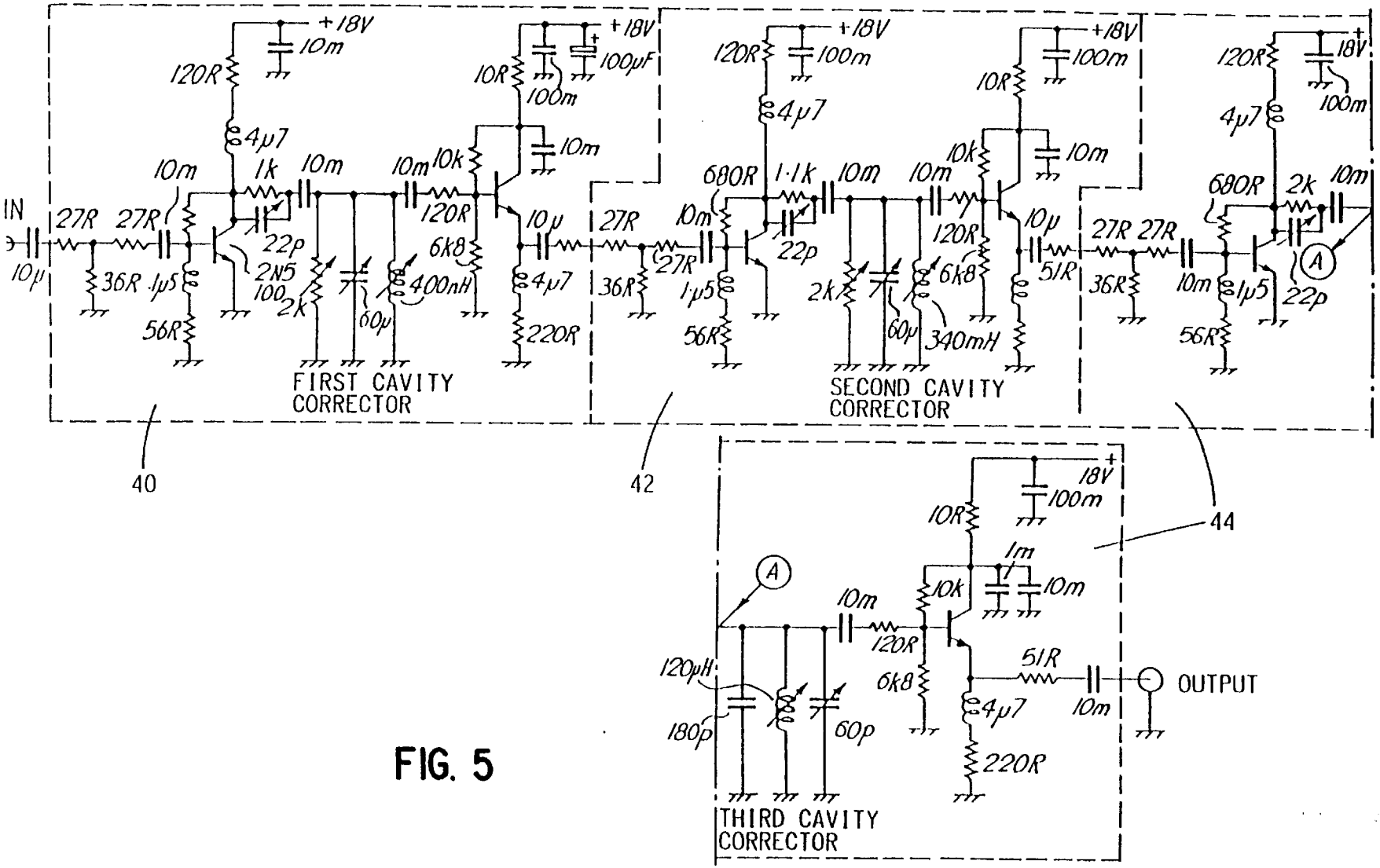
FIG. 5 is a circuit diagram of a three-stage pre-correction filter for use in the system of FIG. 4.

FIG. 5 shows one example of the pre-correction filter 26 which needs to be added for a four cavity klystron. The circuit comprises three series-connected filter modules 40, 42, 44, one for each of the first, second and third cavities. Each of the filter modules includes a parallel RCL tuning network 46 providing a corrector circuit for the respective cavities.

Figure 6:
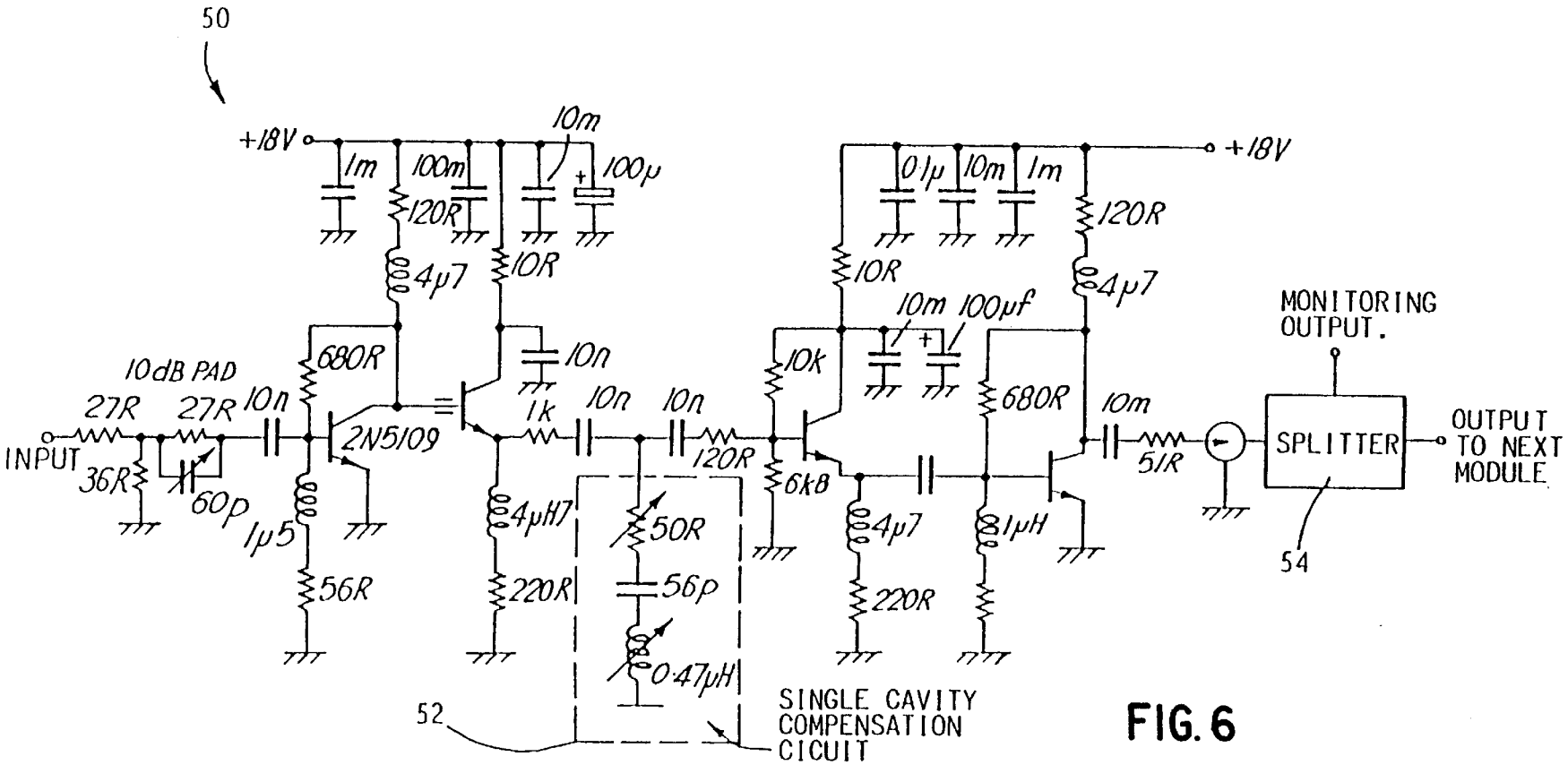
FIG. 6 is a circuit diagram illustrating one stage of the post-correction filter in the system of FIG. 4.

The corresponding post-correction filter 28 is also comprised of series-connected filter modules 50, one of which is shown in FIG. 6. One similar module is required to equalise each of the three pre-correction filter modules 40, 42, 44, of the pre-correction filter 26. The module includes a series RCL network 52 providing a cavity compensation circuit for respective ones of the three cavities. The splitter 54 provides a monitoring output for the module 50 in addition to the module signal output. Other features of the construction of the pre- and post-correction filter modules will be apparent to those of ordinary skill in the art from the figures and thus are not described here in further detail.

FIG. 7 shows how the principle can be extended to provide additional compensation. Most of the non-linearity arises between the third and final cavities of the klystron. However, a minor but significant amount of non-linearity arises from the interaction area between the second and third cavities. In FIG. 7 two correctors are shown. In addition to the corrector 18 already described, another corrector 30 with a pre-correction filter 32 and post-correction filter 34 surrounding a compensating non-linear amplifier 36 is included, as shown. The circuit when correctly set up is effectively "transparent" as between points I—I and as between points II—II. In practice the corrector 30 may not be easy construct because the filters are required to have a high Q value.

While described in the context of a 4-cavity klystron amplifier, the invention is also applicable to three-cavity klystrons or other active devices such as klystrodes, tetrodes, or solid state devices for example. While the example described shows the pre-correction filter and post-correction filter in conventional circuit form, in practice they are likely to be designed as active filters.

We claim:

1. A method of compensating for non-linear characteristics of an active device (10), the active device having a transfer characteristic corresponding to the accumulated characteristics of a first filter stage (12) and a first non-linear device (14) in series connection, the method comprising modifying a signal prior to supply to the active device by the steps of:

a) filtering the signal by a first pre-correction filter (26) having a frequency response characteristic determined by that of the said first filter stage (12);

b) amplifying the pre-correction filtered signal using a first non-linear amplifier (20) having an input/output transfer characteristic complementary to that of the said first non-linear device (14); and c) filtering the amplified signal by a first post-correction filter (28) having a frequency response characteristic complementary to that applied at step a).

2. A method according to claim 1, in which said step of filtering by said first pre-correction filter (26) is achieved with a frequency response characteristic substantially identical to that of said first filter stage (12) but is reversed in the I.F. frequency spectrum.

3. A method according to claim 1, in which the active device transfer characteristic corresponds to the accumulated characteristics of n filter stage (12) and non-linear device (14) pairs in series connection, where n is an integer greater than 1, and steps a)–c) are sequentially performed n times for respective ones of the n filter stage and non-linear device pairs.

4. A method according to claim 3, in which the signal modification by steps a)–c) is respectively performed in the order of the nth to first filter stage and non-linear device pair.

5. A method according to claim 1, in which the active device transfer characteristic corresponds to the accumulated characteristics of n series connected filter stages (12) and the said first non-linear device (14), where n is an integer greater than 1, comprising performing step a) in respect of each of the n filter stages in sequence and using respective ones of n pro-correction filters (26), performing step b), and performing step c) sequentially using n post-correction filters (28).

6. A method according to any of claims 1 to 5, comprising the further step of applying differential gain and phase correction (25) to the signal prior to performing steps a)–c).

7. A signal processing circuit comprising a first drive circuit (18) and an active device (10) connected in series between a processing circuit signal input and signal output, the active device (10) having a transfer characteristic corresponding to the accumulated characteristics of a first filter stage (12) and a first non-linear device (14) in series connection, and the first drive circuit (18) comprising, in series connection from a drive circuit signal input:

i) a first pro-correction filter (26) having a frequency response characteristic determined by that of the said first filter stage (12);

ii) a first non-linear amplifier (20) having an input/output transfer characteristic complementary to that of the said first non-linear device (14); and iii) a first post-correction filter (28) having a frequency response characteristic complementary to that of the said first pro-correction filter (26);

wherein the output of the said first post-correction filter provides a drive circuit signal output.

8. A circuit according to claim 7, in which the first pro-correction filter (26) frequency response characteristic is substantially identical to that of the said first filter stage (12) but is reversed in the I.F. frequency spectrum.

9. A circuit according to claim 7, in which the active device transfer characteristic corresponds to the accumulated characteristics of n filter stage and non-linear device pairs in series connection, where n is an integer greater than 1, comprising n−1 further drive circuits (30) connected in series with the first drive circuit (18), the $m^{th}$ drive circuit, where $n \geqq m > 1$, comprising:

i) an $m^{th}$ pre-correction filter (32) having a frequency response characteristic determined by that of the $m^{th}$ filter stage;

ii) an $m^{th}$ non-linear amplifier (36) having an input/output transfer characteristic complementary to that of the $m^{th}$ non-linear device; and iii) an $m^{th}$ post-correction filter (34) having a frequency response characteristic complementary to that of the $m^{th}$ pre-correction filter.

10. A circuit according to claim 9, in which the n drive circuits (18, 30) are arranged in the order of $n^{th}$ to 1st and the n filter stage and non-linear device pairs are arranged in the order of 1st to $n^{th}$, in series from the processing circuit signal input to the signal output.

11. A circuit according to claim 7, in which the active device transfer characteristic corresponds to the accumulated characteristics of n series connected filter stages (12) and the said first non-linear device (14), where n is an integer greater than 1, the first drive circuit further comprising n−1 further pre-correction filters in series connection between the drive circuit signal input and the first pre-correction filter (26), and n−1 further post-correction filters in series connection between the first post-correction filter (28) and the drive circuit signal output.

12. A circuit according to any of claims 7 to 11, further comprising differential gain and phase correction means (25) at the said processing circuit signal input.

13. A circuit according to claim 7 or claim 8, in which the active device is a multiple-cavity klystron, the said first filter stage (12) frequency response characteristic is that of the first to penultimate cavities, and the first non-linear device (14) transfer characteristic is that of the interaction area between the penultimate and final cavities.

14. A circuit according to claim 13, in which the active device is a four cavity klystron amplifier.

15. In a broadcast television transmitter having a klystron amplifier, said klystron amplifier comprising a drive circuit (18) and a klystron (10) driven by said drive circuit, said klystron (10) having a transfer characteristic corresponding to the accumulated characteristics of a first filter stage (12) and a first non-linear device (14) in series connection, and said drive circuit (18) having an input and an output and comprising a non-linear amplifier (20) having an input/output transfer characteristic complementary to that of said klystron first non-linear device (14), the improvement residing in that said drive circuit (18) further comprises a pre-correction filter (26) connected between said drive circuit input and said non-linear amplifier (20), and a post-correction filter (28) connected between said non-linear amplifier (20) and said drive circuit output, wherein said pre-correction filter (26) has a frequency response characteristic determined by that of said first filter stage (12) and said post-correction filter (28) has a frequency response characteristic complementary to that of said pre-correction filer (26).

*16. A method of compensating for non-linear characteristics of an active device (10), the active device having a transfer characteristic corresponding to the accumulated characteristics of a first filter stage (12) and a first non-linear device (14) in series connection, the method comprising modifying a signal prior to supply to the active device by the steps of:*

*a) amplifying the pre-correction filtered signal using a first non-linear amplifier (20) having an input/output transfer characteristic complementary to that of the said first non-linear device (14), and*

*b) filtering the amplified signal by a first post-correction filter (28) having a frequency response characteristic determined by that of the said first filter stage (12).*

*17. A method according to claim 16, in which the active device transfer characteristic corresponds to the accumulated characteristics of n filter stage (12) and non-linear device (14) pairs in series connection, where n is an integer greater than 1, and steps a) and b) are sequentially performed n times for respective ones of the n filter stare and non-linear device pairs.*

*18. A method according to claim 17, in which the signal modification by steps a) and b) is respectively performed in the order of the nth to first filter stare and non-linear device pair.*

*19. A signal processing circuit comprising a first drive circuit (18) and an active device (10) connected in series between a processing circuit signal input and signal output, the active device (10) having a transfer characteristic corresponding to the accumulated characteristics of a first filter stage (12) and a first non-linear device (14) in series connection, and the first drive circuit (18) comprising, in series connection from a drive circuit signal input:*

*i) a first non-linear amplifier (20) having an input/output transfer characteristic complementary to that of said first non-linear device (14); and*

*ii) a first post-correction filter (28) having a frequency response characteristic determined by that of said first filter stage (12);*

*wherein the output of said first post-correction filter provides a drive circuit signal output.*

*20. A circuit according to claim 19, in which the active device transfer characteristic corresponds to the accumulated characteristics of n filter stage and non-linear device pairs in series connection, where n is an integer greater than 1, comprising n−1 further drive circuits (30) connected in series with the first drive circuit (18), the $m^{th}$ drive circuit, where $n \geqq m > 1$, comprising:*

*i) an $m^{th}$ non-linear amplifier (36) having an input/output transfer characteristic complementary to that of the $m^{th}$ non-linear device; and*

*ii) an $m^{th}$ post-correction filter (34) having a frequency response characteristic determined by that of the $m^{th}$ filter stage.*

*21. A circuit according to claim 20, in which the n drive circuits (18, 30) are arranged in the order of $n^{th}$ to 1st and the n filter stage and non-linear device pairs are arranged in the order of 1st to $n^{th}$, in series from the processing circuit signal input to the signal output.*

*22. A circuit according to claim 19, in which the active device is a multiple-cavity klystron, the said first filter stage (12) frequency response characteristic is that of the first to penultimate cavities, and the first non-linear device (14) transfer characteristic is that of the interaction area between the penultimate and final cavities.*

*23. A circuit according to claim 22, in which the active device is a four cavity klystron amplifier.*

*24. In a broadcast television transmitter having a klystron amplifier, said klystron amplifier comprising a drive circuit (18) and a klystron (10) driven by said drive circuit, said klystron (10) having a transfer characteristic corresponding to the accumulated characteristics of a first filter stage (12) and a first non-linear device (14) in series connection, and said drive circuit (18) having an input and an output and comprising a non-linear amplifier (20) having an input/output transfer characteristic complementary to that of said klystron first non-linear device (14), the improvement residing in that said drive circuit (18) further comprises a post-correction filter (28) connected between said non-linear amplifier (20) and said drive circuit output, wherein said post-correction filter (28) has a frequency response characteristic determined by that of said first filter stage.*

* * * * *